(12) United States Patent
Goldmann et al.

(10) Patent No.: US 7,443,026 B2
(45) Date of Patent: Oct. 28, 2008

(54) IC CHIP PACKAGE HAVING FORCE-ADJUSTABLE MEMBER BETWEEN STIFFENER AND PRINTED CIRCUIT BOARD

(75) Inventors: Lewis S. Goldmann, Bedford, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 69 days.

(21) Appl. No.: 11/470,434

(22) Filed: Sep. 6, 2006

(65) Prior Publication Data

US 2008/0123311 A1    May 29, 2008

(51) Int. Cl.
H01L 23/34    (2006.01)

(52) U.S. Cl. .......................... 257/727; 257/718; 438/117

(58) Field of Classification Search .................. 257/701, 257/718, 719, 706, 707, 726, 727; 438/117, 438/121, 125, 726, 727
See application file for complete search history.

(56) References Cited

U.S. PATENT DOCUMENTS 5,528,462 A * 6/1996 Pendse ........................ 361/767
6,212,074 B1 * 4/2001 Gonsalves et al. ........... 361/717
6,475,011 B1 * 11/2002 Sinha et al. .................. 439/330
6,541,855 B2 * 4/2003 Uzuka .......................... 257/712
6,658,729 B2 * 12/2003 Brodsky ....................... 29/832
6,765,397 B2 * 7/2004 Corbin et al. ............... 324/754
6,964,885 B2   11/2005 Coico et al.
6,986,668 B2   1/2006 Brodsky

* cited by examiner

*Primary Examiner*—S. V Clark
(74) *Attorney, Agent, or Firm*—Joseph Petrokaitis; Hoffman Warnick LLC

(57) ABSTRACT

An IC chip package and related method are disclosed. The IC chip package may include a printed circuit board (PCB) coupled to a chip carrier by a land grid array (LGA) connector; a metal stiffener including at least one force-adjustable member contacting an underside of the PCB; and at least two couplers for coupling the metal stiffener to a lid or a heat sink, with the PCB, the chip carrier and the LGA connector therebetween. The force-adjustable member reduces the required assembly forces and accommodates natural and non-systematic out-of flatness tolerances of the PCB and the chip carrier.

12 Claims, 4 Drawing Sheets

IC CHIP PACKAGE HAVING FORCE-ADJUSTABLE MEMBER BETWEEN STIFFENER AND PRINTED CIRCUIT BOARD

BACKGROUND OF THE INVENTION

1. Technical Field

The invention relates generally to integrated circuit (IC) chip packaging, and more particularly, to an IC chip package having a force-adjustable member between the stiffener and printed circuit board (PCB).

2. Background Art

Referring to FIG. 1, conventional integrated circuit (IC) chip package 10 includes IC chip(s) 12 packaged on a single (not shown) or multiple chip carrier 14 that mates with a printed circuit board (PCB) 16 via a land grid array (LGA) connector 18. Chip package 10 further includes a module lid 26 and a metal stiffener 22, which may have a rigid insulator 24 therein to prevent metal stiffener 22 from shorting the underside of PCB 16. Module lid 26 may include a piston 28 and an adjustable spar 30, which provide thermal and mechanical accommodation of IC chip(s) 12. However, piston 28 and spar 30 are not always used. Metal stiffener 22 and module lid 26 are coupled together by screws/bolts 32 to hold chip package 10 together. A heat sink (not shown) may be provided over lid 26. LGA connector 18 may be interconnected to PCB 16 with a mechanical spring array (referred to as a double-LGA connector) or with a solder ball array (referred to as a hybrid LGA/BGA connector).

Ideally, chip package 10 has uniform force applied to chip carrier 14 and PCB 16. Although an individual spring within LGA connector 18 requires only 20-30 grams to insure robust performance over product lifetime, spring force is notoriously non-uniform, especially on a large multichip carrier 14. As a result, the spring force can vary at different locations on LGA connector 18. There are several causes of the non-uniformity of spring force. First, the retention screws/bolts 32 are of necessity outside the periphery of PCB 16. The collective spring forces thus tend to flex chip carrier 14, PCB 16 and/or metal stiffener 22, and locally tends to push parts away from each other. This situation also tends to relax contacts in the center of LGA connector 18. Second, PCBs 16 and chip carriers 14 originate having significant non-planarity, which varies in magnitude and pattern from part to part.

To insure that even the lowest force sites reach the minimum required spring force, the total clamping, or retention, force applied by screws/bolts 32 must be increased, typically to the equivalent of 90-105 grams per contact (i.e., a 4× overload). Unfortunately, the high clamping forces can introduce excessive flexural stress. One possible method to address this problem is to provide additional layers to the carrier, but this approach impacts cost and electrical performance. By another method, as shown in FIGS. 2 and 3, a polymer bulls-eye structure 36 may be added above rigid insulator 24 to help compensate for flexure by reinforcing the pressure at the center of chip package 10. Polymer bulls-eye structure 36 prevents having to increase the retention force of screws/bolts 32 even further, but requires dimensional consistency of the chip carrier 14, PBC 16 and stiffener 22. Unfortunately, the problems described above remain because the peripheral screws/bolts 32 are used both for chip package 10 assembly and to generate spring force.

SUMMARY OF THE INVENTION

An IC chip package and related method are disclosed. The IC chip package may include a printed circuit board (PCB) coupled to a chip carrier by a land grid array (LGA) connector; a metal stiffener including at least one force-adjustable member contacting an underside of the PCB; and at least two couplers for coupling the metal stiffener to a lid or a heat sink with the PCB, the chip carrier and the LGA connector therebetween. The force-adjustable member reduces the required assembly forces and accommodates natural and non-systematic out-of flatness tolerances of the PCB and the chip carrier.

A first aspect of the invention provides a chip package comprising: a printed circuit board (PCB) coupled to a chip carrier by a land grid array (LGA) connector; a metal stiffener including at least one force-adjustable member contacting an underside of the PCB; and at least two couplers for coupling the metal stiffener to a lid or a heat sink, with the PCB, the chip carrier and the LGA connector therebetween.

A second aspect of the invention provides a method packaging an integrated circuit (IC) chip, the method comprising: providing a printed circuit board (PCB) coupled to a chip carrier by a land grid array (LGA) connector, the chip carrier holding the IC chip; coupling a lid or a heat sink to a metal stiffener with the PCB, the chip carrier and the LGA connector therebetween, the metal stiffener including at least one force-adjustable member contacting an underside of the PCB; and adjusting a spring force applied to at least one of the PCB, the LGA connector and the chip carrier by adjusting a force applied by the force-adjustable member.

The illustrative aspects of the present invention are designed to solve the problems herein described and/or other problems not discussed.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 4:
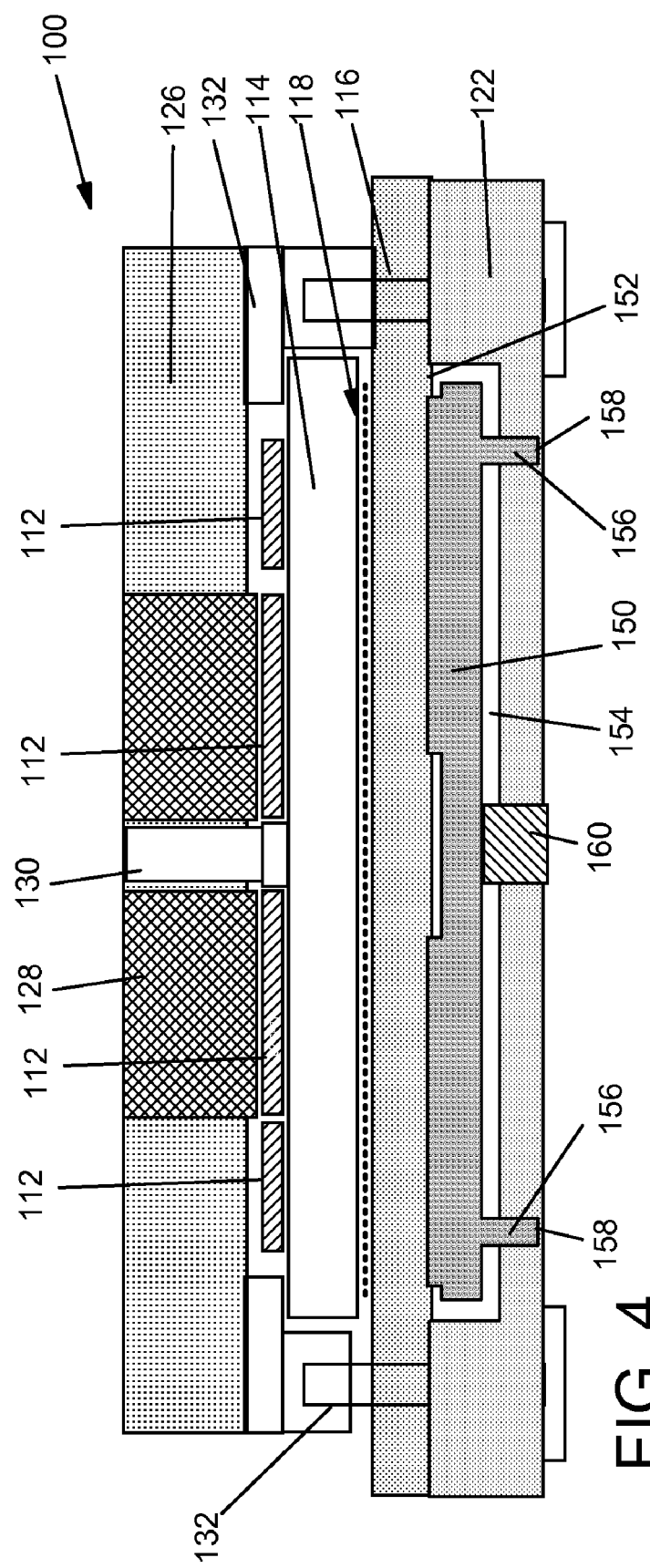
FIG. 4 shows one embodiment of an IC chip package.

Turning to the drawings, FIG. 4 shows one embodiment of an integrated circuit (IC) chip package 100 according to the invention. IC chip package 100 includes a printed circuit board (PCB) 116 coupled to a single or multichip carrier 114 (hereinafter "chip carrier") by a land grid array (LGA) connector 118. Chip carrier 114 may include a multilayer ceramic or a plastic laminate, the latter of which are typically much more flexible and non-flat. LGA connector 118 may be of the type which interconnects to PCB 116 by another mechanical spring array or of the type which interconnects to PCB 116 by a ball grid array (BGA) of solder joints. A lid 126 is coupled to a metal stiffener 122 by at least two couplers 132 with PCB 116, chip carrier 114 and LGA connector 118 therebetween. A hard stop between couplers 132 and PCB 116 (right side FIG. 4) or a gapped arrangement (left side FIG.

4) may be employed. Metal stiffener 122 includes at least one force-adjustable member 150 contacting an underside 152 of PCB 116. Force-adjustable member 150 may be positioned in a recess 154 of metal stiffener 122. Force-adjustable member 150 is made of material stiff enough to maintain shape under load, but soft enough not to damage PCB 116. Acceptable materials may include, for example, a plastic, ceramic or a metal. Force-adjustable member 150 includes an adjustment screw 160 threaded into metal stiffener 122 and accessible from an outside of metal stiffener 122. Adjustment of adjustment screw 160 adjusts the position of force-adjustable member 150 relative to metal stiffener 122, and hence, the spring force applied against PCB 122 (and also LGA connector 118 and chip carrier 114). Each force-adjustable member 150 may include an alignment member 156, e.g., an outwardly extending projection such as a pin, for mating with a complementary alignment element 158, e.g., a mating opening, of metal stiffener 122 to maintain force-adjustable member 150 in proper alignment.

Figure 1:
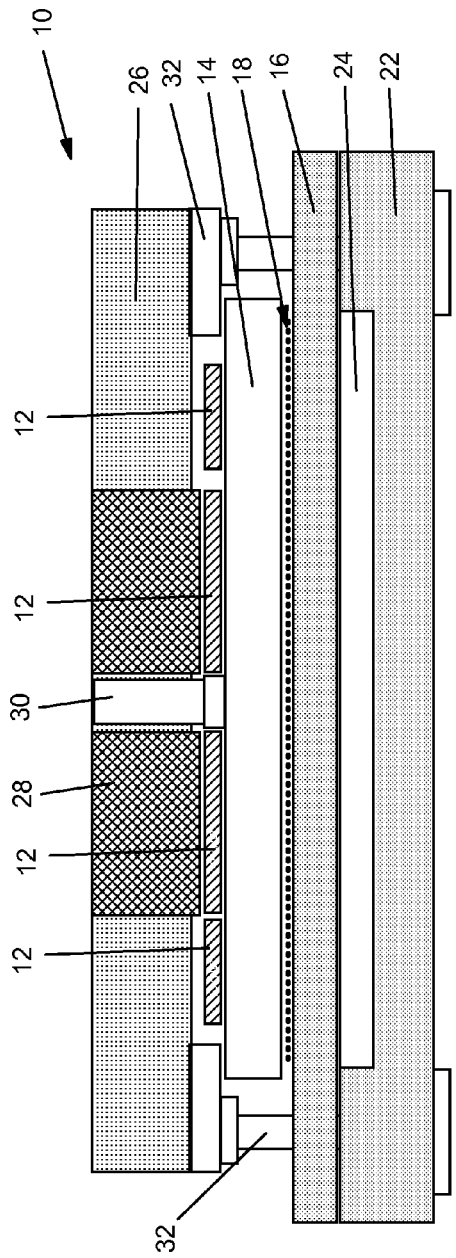
FIG. 1 shows a conventional IC chip package.
Figure 2:
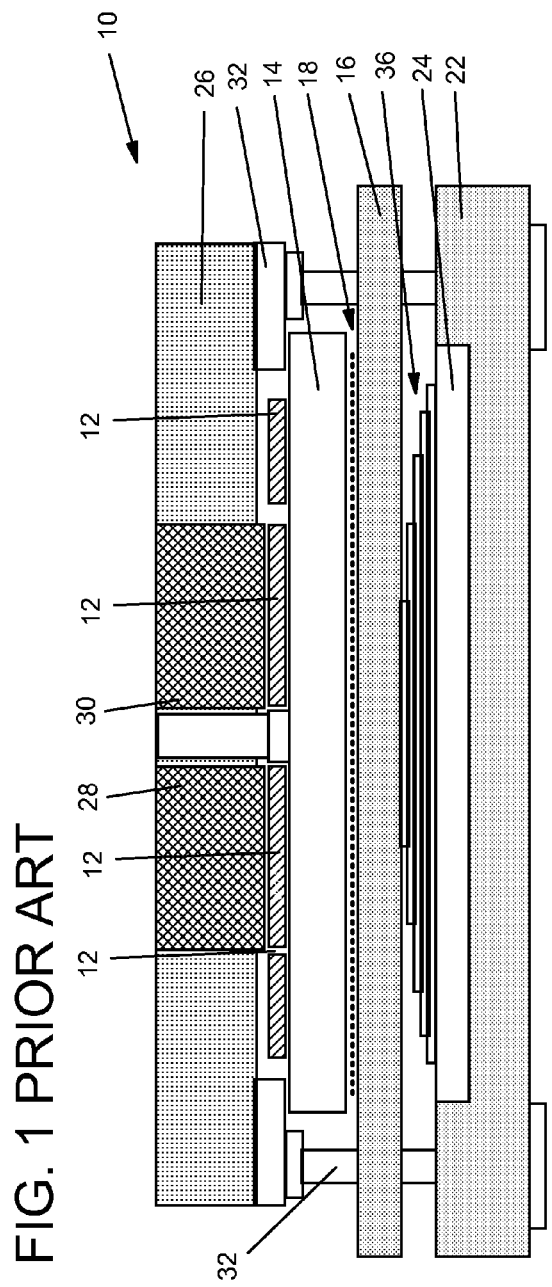
FIG. 2 shows an alternative conventional IC chip package.
Figure 3:
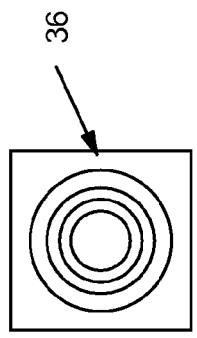
FIG. 3 shows a detail of the IC chip package of FIG. 2.
Figure 5A:
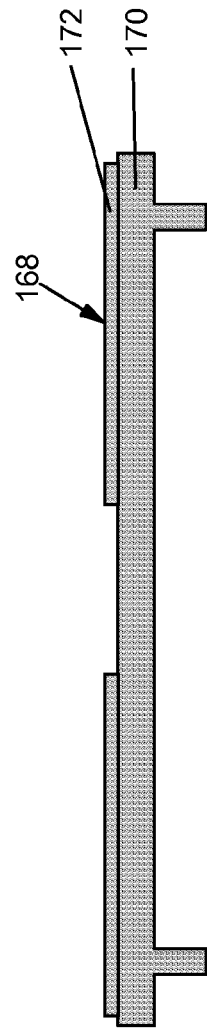
FIGS. 5A-C show alternative embodiments of a force-adjustable member.
Figure 5B:
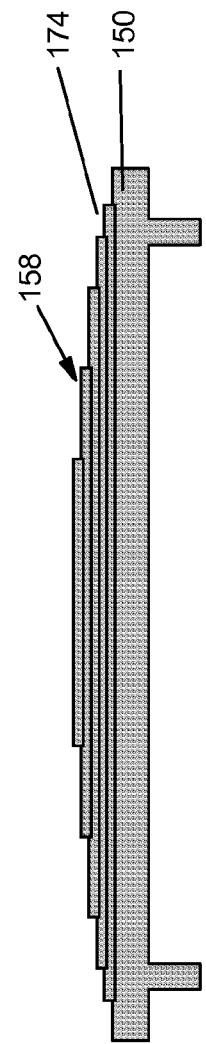
Figure 5C:
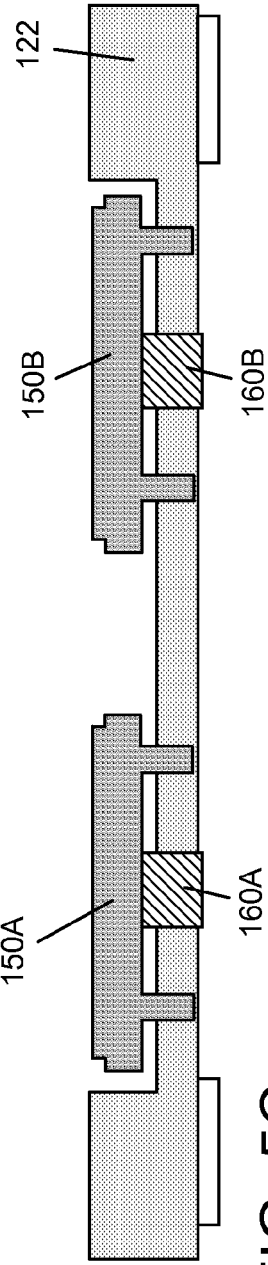

As shown in FIG. 5A, in an alternative embodiment, force-adjustable member 150 may include a composite material 168. For example, force-adjustable member 150 may include a rigid material 170, e.g., plastic, ceramic, metal, etc., with a more elastic material 172, e.g., a polymer, in contact with PCB 116. FIG. 5B shows an alternative embodiment in which force-adjustable member 150 includes a substantially convex surface 158, which would contact underside 154 of PCB 116 in operation. In this case, a polymer bulls-eye structure 174 is illustrated similar to that shown in FIG. 2. However, any substantially convex surface structure may be employed. Furthermore, any specialized surface necessary may be employed on force-adjustable member 150 to, for example, accommodate irregularities on underside 152 of PCB 116. FIG. 5C shows another alternative embodiment in which a plurality of force-adjustable members 150A, 150B may be provided with a single metal stiffener 122. Although only two force-adjustable members 150A, 150B are shown, any number may be employed. In this case, each force-adjustable member 150A, 150B, may include an adjustment screw 160A, 160B, respectively, accessible from an outside of metal stiffener 122. Adjustment of each adjustment screw 160A, 160B allows for precise force adjustment on PCB 116, e.g., to remove local non-flatness.

Figure 6:
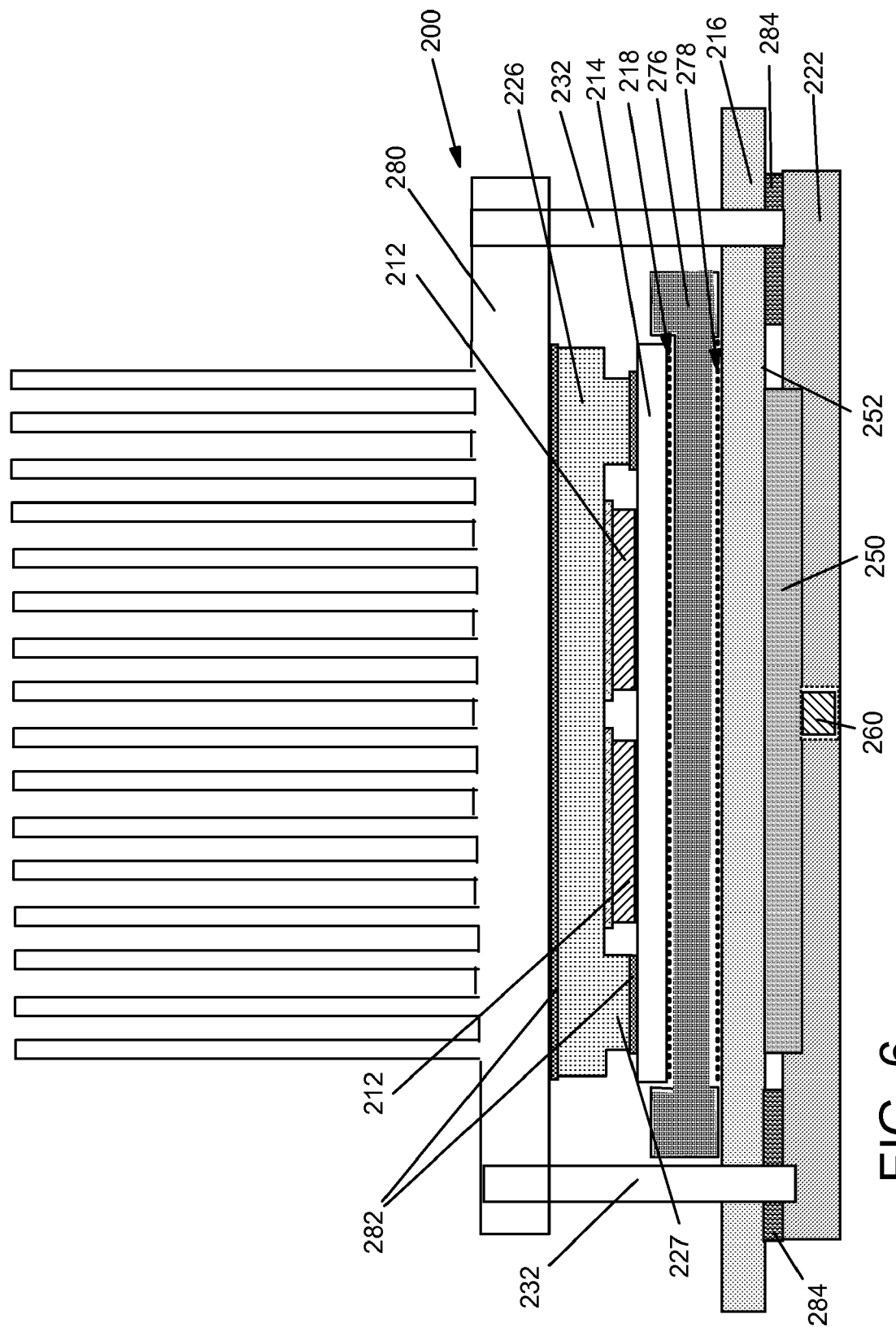
FIG. 6 shows another embodiment of an IC chip package.

FIG. 6 shows an alternative embodiment of an IC chip package 200 including a printed circuit board (PCB) 216 coupled to a single or multichip carrier 214 (hereinafter "chip carrier") by a land grid array (LGA) connector 218. A spring carrier 276 may also be provided with another LGA or ball grid array (BGA) connector 278 (hereinafter "LGA/BGA connector"). A lid 226 (with or without legs 227) is positioned over chip carrier 214, and a heat sink 280 is coupled to a metal stiffener 222 by at least two couplers 232 with PCB 216, chip carrier 214, LGA connector 218 and lid 226 therebetween. A thermal interface material (TIM) 282 may be positioned between lid 226 and heat sink 280 and/or chip(s) 212. An insulator washer 284 may be positioned between metal stiffener 222 and PCB 216. Metal stiffener 222 includes at least one force-adjustable member 250 contacting an underside 252 of PCB 216. Force-adjustable member 250 includes an adjustment screw 260 threaded into metal stiffener 222 and accessible from an outside of metal stiffener 222. Adjustment of adjustment screw 260 adjusts the position of force-adjustable member 250 relative to metal stiffener 222, and hence, the spring force applied against PCB 222 (and also LGA connector 218 and chip carrier 114 (and lid 226, spring carrier 276 and LGA/BGA connector 278, where provided)). The teachings of FIGS. 5A-C, and alignment members 156, 158 (FIG. 4), are also applicable to the embodiment of FIG. 6.

In operation, IC chip(s) 112, 212 may be packaged by providing PCB 116, 216 coupled to chip carrier 114, 214 by LGA connector 118, 218 with chip carrier 114, 214 holding IC chip(s) 112, 212. Lid 126 or heat sink 280 is coupled to metal stiffener 122, 222 by couplers 132, 232 with PCB 116, 216, chip carrier 114, 214 and LGA connector 118, 218 therebetween. As described above, metal stiffener 122, 222 includes at least one force-adjustable member 150, 250 contacting underside 152, 252 of PCB 116, 216. Adjustment of a spring force applied to at least one of PCB 116, 216, LGA connector 118, 218 and chip carrier 114, 214 (and lid 226, spring carrier 276 and LGA/BGA connector 278, where provided) may then be made by adjusting a force applied by force-adjustable member 150, 250, i.e., by adjusting adjustment screw 160, 260 accessible from an outside of metal stiffener 150. As a result, couplers 132, 232 need only a low force, perhaps the equivalent of only approximately 5-10 g/contact, thus significantly reducing flexure. Accordingly, the required assembly forces can be reduced and natural and non-systematic out-of flatness tolerances of PCB 116, 216 and chip carrier 114, 216 can be accommodated. Adjustment screw 160, 260 provides localized pressure just under LGA connector 118, 218, just where it is needed. Moreover, by applying the same torque on adjustment screw 160, 260 of all chip packages 100, 200, the pressure will be automatically be individualized to the dimensional idiosyncrasies of that particular set of parts. The correct torque may be determined by prior experimentation. Although applicable to any type of chip carrier 114, 214, force-adjustable member 150, 250 with adjustment screw 160, 260 are especially useful with plastic carriers because they are typically more flexible and non-flat. As noted above, a plurality of force-adjustable members 150A-150B (FIG. 5C) may be provided, each including an adjustment screw accessible from an outside of metal stiffener 122. Also, force-adjustable member 150 may include a composite material 170, 172 (FIG. 5A) and/or a substantially convex upper surface 174.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A chip package comprising:
   a printed circuit board (PCB) coupled to a chip carrier by a land grid array (LGA) connector;
   a metal stiffener including at least one force-adjustable member contacting an underside of the PCB, wherein the at least one force-adjustable member includes an adjustment screw that presses against the at least one force-adjustable member; and
   at least two couplers for coupling the metal stiffener to a lid or a heat sink, with the PCB, the chip carrier and the LGA connector therebetween.

2. The chip package of claim 1, wherein the adjustment screw is accessible from an outside of the metal stiffener.

3. The chip package of claim 1, wherein the at least one force-adjustable member includes a plurality of force-adjustable members, each including an adjustment screw accessible from an outside of the metal stiffener.

4. The chip package of claim 1, wherein the force-adjustable member includes a composite material.

5. The chip package of claim 1, wherein the force-adjustable member includes a substantially convex surface contacting the underside of the PCB.

6. The chip package of claim 1, wherein each force-adjustable member includes an alignment member for mating with a complementary alignment element of the metal stiffener to maintain the force-adjustable member in proper alignment.

7. The chip package of claim 1, wherein the chip carrier includes a multilayer ceramic.

8. The chip package of claim 1, wherein the chip carrier includes a plastic laminate.

9. A method packaging an integrated circuit (IC) chip, the method comprising:
providing a printed circuit board (PCB) coupled to a chip carrier by a land grid array (LGA) connector, the chip carrier holding the IC chip;
coupling a lid or a heat sink to a metal stiffener with the PCB, the chip carrier and the LGA connector therebetween, the metal stiffener including at least one force-adjustable member contacting an underside of the PCB, wherein the at least one force-adjustable member includes an adjustment screw that presses against the at least one force-adjustable member; and
adjusting a spring force applied to at least one of the PCB, the LGA connector and the chip carrier by adjusting a force applied by the force-adjustable member.

10. The method of claim 9, wherein the adjusting includes adjusting the adjustment screw that is accessible from an outside of the metal stiffener.

11. The method of claim 9, wherein the at least one force-adjustable member includes a plurality of force-adjustable members, each including an adjustment screw accessible from an outside of the metal stiffener.

12. The method of claim 9, wherein the force-adjustable member includes a composite material.

* * * * *